US010510542B2

(12) United States Patent
Kao et al.

(10) Patent No.: US 10,510,542 B2
(45) Date of Patent: Dec. 17, 2019

(54) GATE ELECTRODES WITH NOTCHES AND METHODS FOR FORMING THE SAME

(71) Applicant: Taiwan Semiconductor Manufacturing Company, Ltd., Hsinchu (TW)

(72) Inventors: Min-Feng Kao, Chiayi (TW); Szu-Ying Chen, Toufen Township (TW); Dun-Nian Yaung, Taipei (TW); Jen-Cheng Liu, Hsinchu (TW); Tzu-Hsuan Hsu, Kaohsiung (TW); Feng-Chi Hung, Chu-Bei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 63 days.

(21) Appl. No.: 15/905,119

(22) Filed: Feb. 26, 2018

(65) Prior Publication Data

US 2018/0190494 A1 Jul. 5, 2018

Related U.S. Application Data

(60) Continuation of application No. 15/043,963, filed on Feb. 15, 2016, now Pat. No. 9,905,426, which is a (Continued)

(51) Int. Cl.

*H01L 21/336* (2006.01)
*H01L 21/265* (2006.01)

(Continued)

(52) U.S. Cl.

CPC .... *H01L 21/2652* (2013.01); *H01L 21/28114* (2013.01); *H01L 21/76229* (2013.01); *H01L 23/544* (2013.01); *H01L 27/1464* (2013.01); *H01L 27/14609* (2013.01); *H01L 29/42376* (2013.01); *H01L 29/665* (2013.01);

(Continued)

(58) Field of Classification Search

CPC ........... H01L 21/2652; H01L 21/28114; H01L 21/76229; H01L 2223/54426; H01L 2223/54453; H01L 23/544; H01L 27/14609; H01L 27/1464; H01L 29/42376;

(Continued)

(56) References Cited

U.S. PATENT DOCUMENTS 4,818,715 A * 4/1989 Chao ................ H01L 29/42376 257/344
5,061,647 A * 10/1991 Roth .................. H01L 29/6659 257/407

(Continued)

FOREIGN PATENT DOCUMENTS

JP 2000680500 A 3/2000
KR 20110067014 A 6/2011

*Primary Examiner* — Meiya Li
(74) *Attorney, Agent, or Firm* — Slater Matsil, LLP

(57) ABSTRACT

A device includes a semiconductor substrate, and a Device Isolation (DI) region extending from a top surface of the semiconductor substrate into the semiconductor substrate. A gate dielectric is disposed over an active region of the semiconductor substrate, wherein the gate dielectric extends over the DI region. A gate electrode is disposed over the gate dielectric, wherein a notch of the gate electrode overlaps a portion of the DI region.

20 Claims, 11 Drawing Sheets

100
42 31 38 8B 126 42
8A 8A
46 46
38 31 38 8B 38 32

Related U.S. Application Data division of application No. 13/474,512, filed on May 17, 2012, now Pat. No. 9,263,272.

(60) Provisional application No. 61/637,701, filed on Apr. 24, 2012.

(51) Int. Cl.

| | |
|---|---|
| ***H01L 21/762*** | (2006.01) |
| ***H01L 21/28*** | (2006.01) |
| ***H01L 29/423*** | (2006.01) |
| ***H01L 23/544*** | (2006.01) |
| ***H01L 29/66*** | (2006.01) |
| ***H01L 29/78*** | (2006.01) |
| ***H01L 27/146*** | (2006.01) |

(52) U.S. Cl.
CPC ...... *H01L 29/6659* (2013.01); *H01L 29/7833* (2013.01); *H01L 2223/54426* (2013.01); *H01L 2223/54453* (2013.01); *H01L 2924/0002* (2013.01)

(58) Field of Classification Search
CPC H01L 29/665; H01L 29/6659; H01L 29/7833
See application file for complete search history.

(56) References Cited

U.S. PATENT DOCUMENTS

| | | | | |
|---|---|---|---|---|
| 5,182,619 | A * | 1/1993 | Pfiester | H01L 29/41775 257/382 |
| 5,654,218 | A * | 8/1997 | Lee | H01L 29/42376 438/301 |
| 5,801,427 | A * | 9/1998 | Shiratake | H01L 21/0276 257/412 |
| 6,011,290 | A | 1/2000 | Gardner et al. | |
| 6,121,666 | A | 9/2000 | Burr | |
| 6,528,363 | B2 * | 3/2003 | Ku | H01L 21/28114 257/E21.205 |
| 2007/0023846 | A1 | 2/2007 | Cox | |
| 2007/0252240 | A1 | 11/2007 | Andresen et al. | |
| 2010/0022077 | A1 | 1/2010 | Krull et al. | |
| 2010/0052019 | A1 | 3/2010 | Yamamoto et al. | |

* cited by examiner

200/2
20
52
54
50
100
21
24
126
45
44
32
40

GATE ELECTRODES WITH NOTCHES AND METHODS FOR FORMING THE SAME

PRIORITY CLAIM AND CROSS-REFERENCE

This application is a continuation of U.S. patent application Ser. No. 15/043,963, entitled "Gate Electrodes with Notches and Methods for Forming the Same," filed on Feb. 15, 2016, which is divisional of U.S. patent application Ser. No. 13/474,512, entitled "Gate Electrodes with Notches and Methods for Forming the Same," filed on May 17, 2012, now U.S. Pat. No. 9,263,272 issued Feb. 16, 2016, which application claims the benefit of U.S. Provisional Application No. 61/637,701, entitled "Gate Electrodes with Notches and Methods for Forming the Same," filed Apr. 24, 2012, which applications are hereby incorporated herein by reference.

BACKGROUND

In the manufacturing of integrated circuits, the sizes of integrated circuit devices are scaled down increasingly. For example, Complementary Metal-Oxide-Semiconductor (CMOS) Image Sensor (CIS) chips have increasingly smaller pixel sizes. Accordingly, the requirement in the DC and noise performance of the CIS chips becomes increasingly stricter. Device Isolation (DI) regions formed by well implantation are thus replacing the conventional Shallow Trench Isolation (STI) regions to isolate devices. With the formation of the DI regions using implantation rather than STI regions, the damage to silicon surfaces caused by the formation of the STI regions is eliminated.

The DI regions are formed by implanting an impurity to portions of a substrate, which portions surround the active regions of the integrate circuit devices that are to be isolated. The implanted impurity has the same conductivity type as the well regions in which the devices are formed. It is, however, difficult to control the accuracy in the overlay of the components of the integrated circuit devices with the DI regions. For example, the accuracy in the overlay between the DI regions and the overlying gate electrodes are difficult to control. In the situations the gate electrodes are misaligned to the DI regions, gate electrodes may not be able to fully separate the channel between the source and drain regions of the MOS devices formed at the DI regions. Leakage currents may occur between the source and drain regions.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A method of forming implanted Device Isolation (DI) regions and a Metal-Oxide-Semiconductor (MOS) device at an active region adjacent the DI regions are provided in accordance with various exemplary embodiments. The intermediate stages of forming the implanted DI regions and the MOS device are illustrated. The variations of the embodiments are discussed. Throughout the various views and illustrative embodiments, like reference numbers are used to designate like elements.

Figure 1:
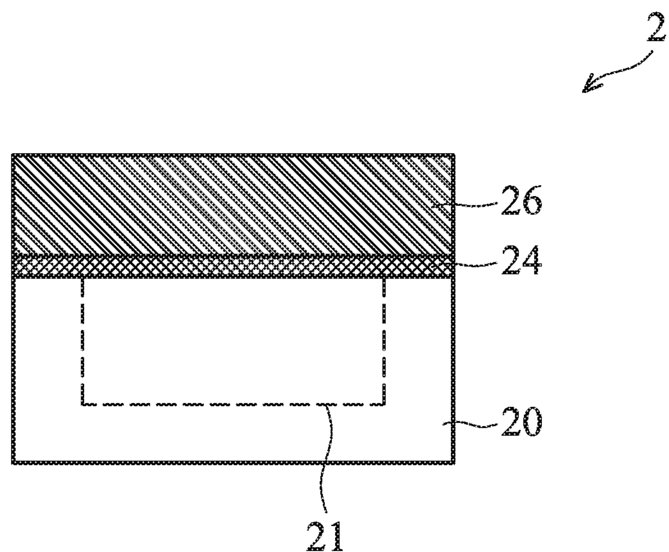
FIGS. 1, 2, 3A, 3B, 4A, 4B, 5A, 5B, 6, 7A-7C and 8A-8C are cross-sectional views and top views of intermediate stages in the manufacturing of a Metal-Oxide-Semiconductor (MOS) device in accordance with some exemplary embodiments.

Referring to FIG. 1, wafer 2, which includes substrate 20, is provided. In some embodiments, substrate 20 is a bulk silicon substrate. In alternative embodiments, substrate 20 is formed of other semiconductor materials such as silicon carbon, silicon germanium, III-V compound semiconductor materials, or the like. Substrate 20 may also be a Silicon-On-Insulator (SOI) substrate. In some embodiments, well region 21 is formed in substrate 20, for example, through implanting a p-type or an n-type impurity into substrate 20.

Gate dielectric layer 24 and gate electrode layer 26 are formed over substrate 20. Gate dielectric layer 24 may include an oxide, a nitride, an oxynitride, a carbide, combinations thereof, and/or multi-layers thereof. Gate electrode layer 26 is conductive, and may be formed of polysilicon. Alternatively, gate electrode layer 26 is formed of other conductive materials such as metals, metal silicides, metal nitrides, and combinations thereof.

Figure 2:
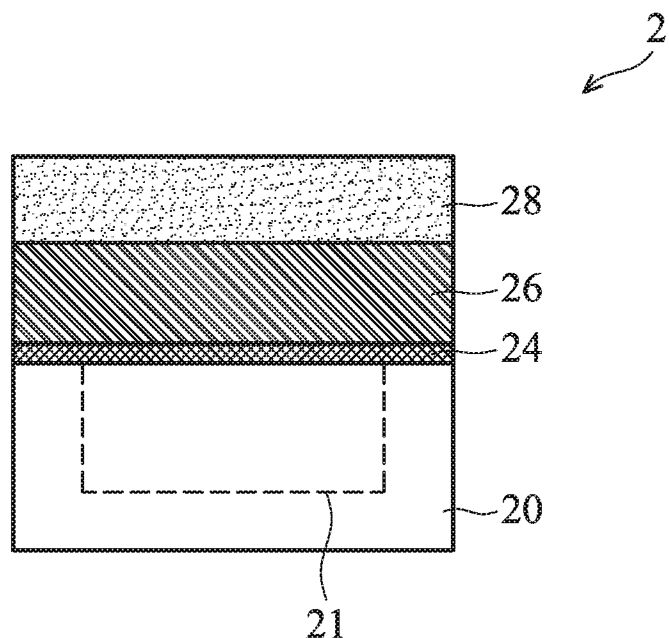
Figure 3A:
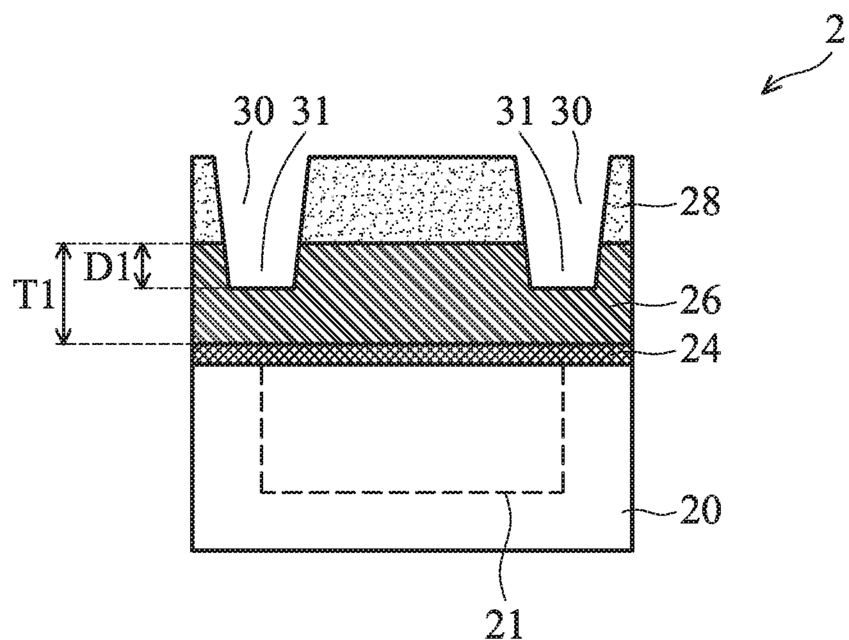
Figure 3B:
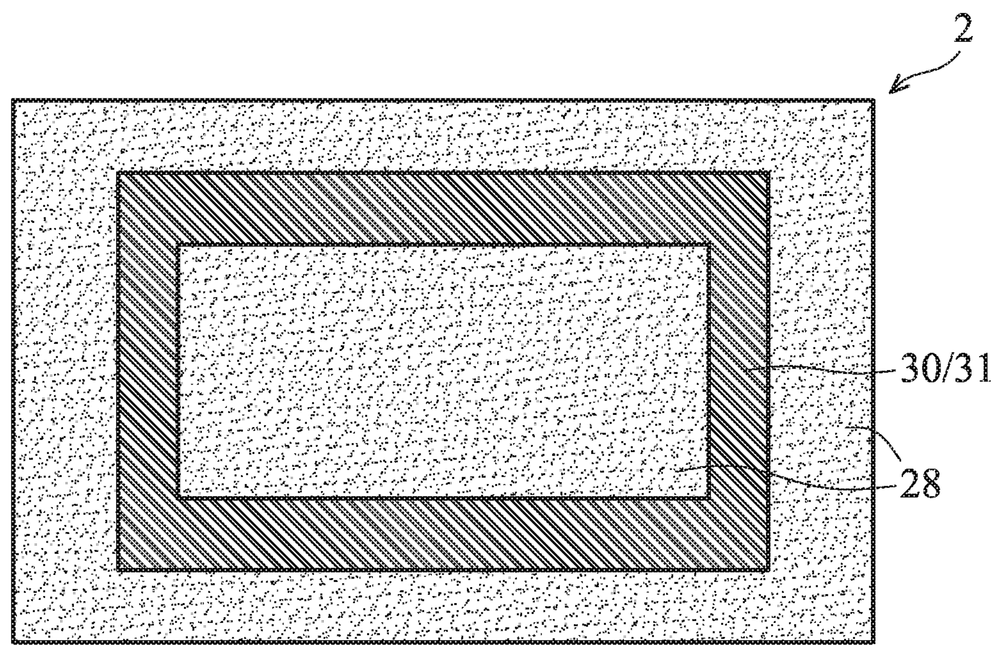

Referring to FIG. 2, hard mask 28 is formed over gate electrode layer 26. In some embodiments, hard mask 28 comprises silicon nitride. In alternative embodiments, hard mask 28 is formed of other dielectric materials such as oxynitride (SiON), silicon carbide or silicon oxide. Next, as shown in FIGS. 3A and 3B, which are a cross-sectional view and a top view, respectively, hard mask 28 is patterned to form openings 30. Openings 30, although looks like separate openings in FIG. 3A, may be parts of a continuous opening 30 (FIG. 3B). In some embodiments, as shown in FIG. 3B, opening 30 forms a full ring. In alternative embodiments, openings 30 have other layouts and shapes, depending on the shape of the devices that is to be isolated.

After the formation of openings 30, an etch step is further preformed to extend openings 30 into gate electrode layer 26 to form notch 31 in gate electrode layer 26. The formation of openings 30 and the formation of notches 31 may be performed using a same etchant or different etchants. For example, the etching of opening 30 may be performed using carbon tetrafluoride as the etchant, and the etching of gate electrode layer 26 may be performed using chlorine as the etchant. Depth D1 of notches 31 may be greater than about 50 Å, or greater than about 150 Å. Depth D1 may also be between about 50 Å and about 950 Å, for example. Depth D1 of notches 31 is also greater enough so that notches 31 are clearly distinguishable, and may be used as alignment marks in subsequent process steps. Depth D1 and thickness T1 of gate electrode layer 26 has ratio D1/T1, which may be between about 0.05 and about 0.95 in accordance with some embodiment. Ratio D1/T1 may also be between about 0.2 and about 0.8. As shown in FIGS. 3A and 3B, when openings 30 form a full ring, notches 31 also form a full ring.

Figure 4A:
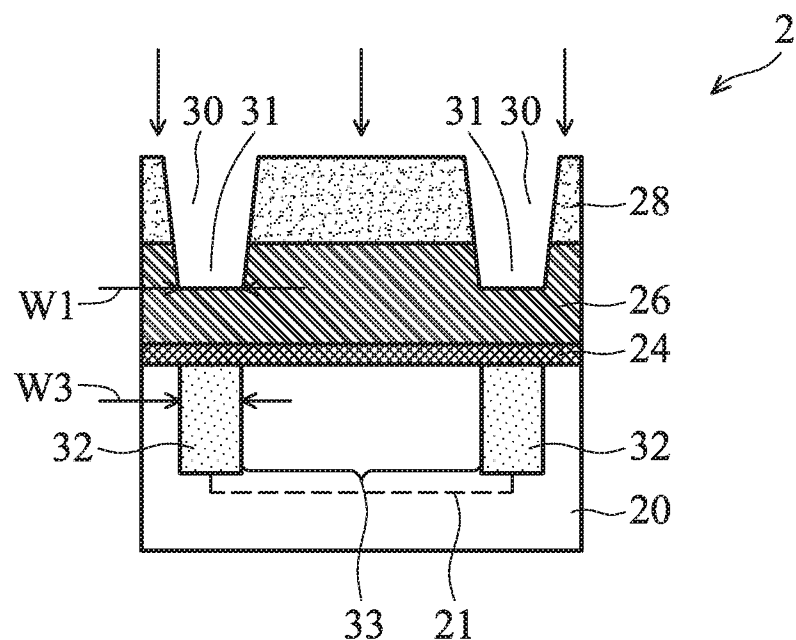
Figure 4B:
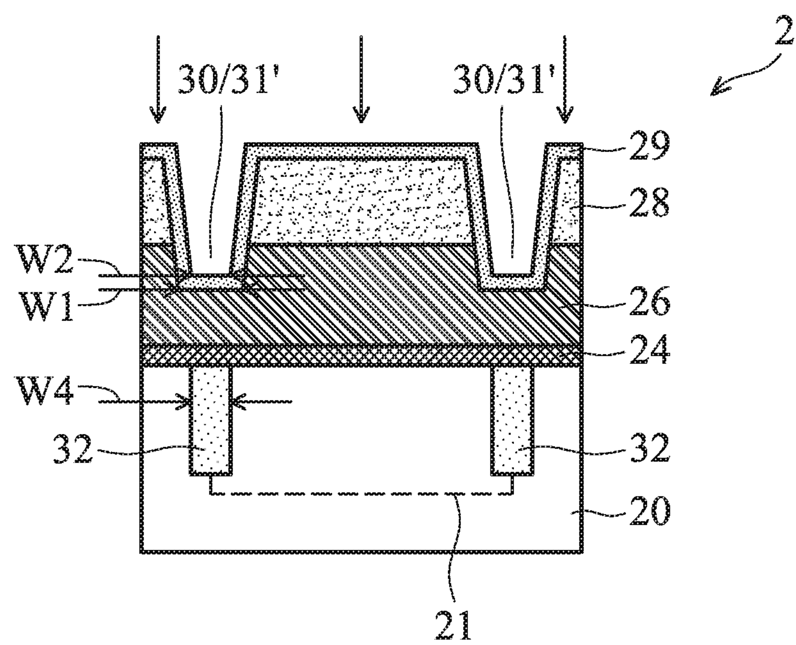

Next, as shown in FIGS. 4A and 4B, implanted DI regions 32 are formed in substrate 20. As a result, active region 33, which may be used for forming a MOS device, is encircled by implanted DI regions 32. The implantation (symbolized by arrows) is performed using an energy level high enough for the implanted impurity to penetrate through the portion of gate electrode layer 26 and gate dielectric layer 24 under notches 31, and not high enough to penetrate through hard mask 28 and the underlying portions of gate electrode layer 26. In some embodiments, the implanted impurity is a p-type impurity that, for example, comprises boron, indium, and/or the like. In alternative embodiments, the implanted impurity is an n-type impurity, for example, comprising phosphorous, arsenic, antimony, and/or the like. The conductivity type of implanted DI regions 32 is also the same as the conductivity type of well region 21.

In FIG. 4A, the implantation for forming implanted DI regions 32 is performed through notches 31 in hard mask 28. In alternative embodiments, as shown in FIG. 4B, additional hard mask 29 is formed over hard mask 28 and filled into notches 31. The unfilled portions of notches 31 are referred to as notches 31'. As a result of the formation of hard mask 29, width W2 of notches 31' is smaller than width W1 of notches 31 (also refer to FIG. 4A). Hard mask 29 may be formed as a conformal layer so that the thickness of hard mask 29 on the sidewalls of openings 30 is substantially equal to the thickness of hard mask 29 on the top surface of hard mask 28. Hard mask 29 may be formed of a same material as hard mask 29 in some embodiments. Alternatively, hard mask 29 and hard mask 28 comprise different materials. With notches 31' having reduced width W2 than width W1 of notches 31, width W4 of implanted DI regions 32 in FIG. 4B is reduced to smaller than width W3 of implanted DI regions 32 in FIG. 4A. The chip area occupied by DI regions 32 is thus reduced due to the formation of hard mask 29.

Figure 5A:
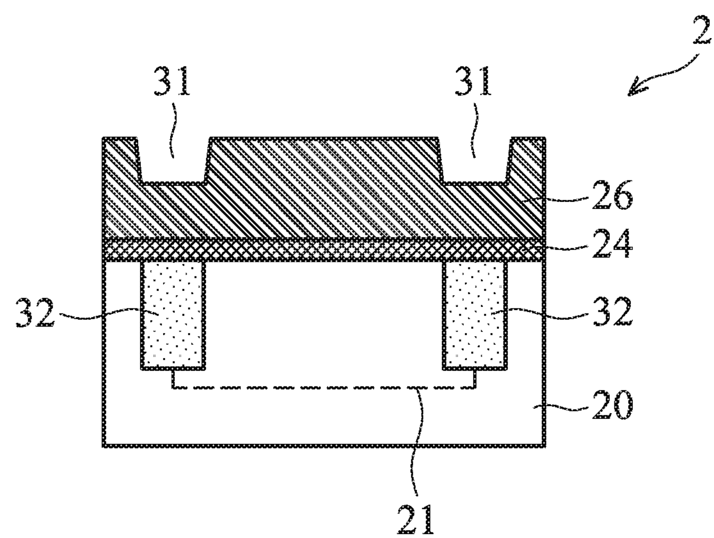
Figure 5B:
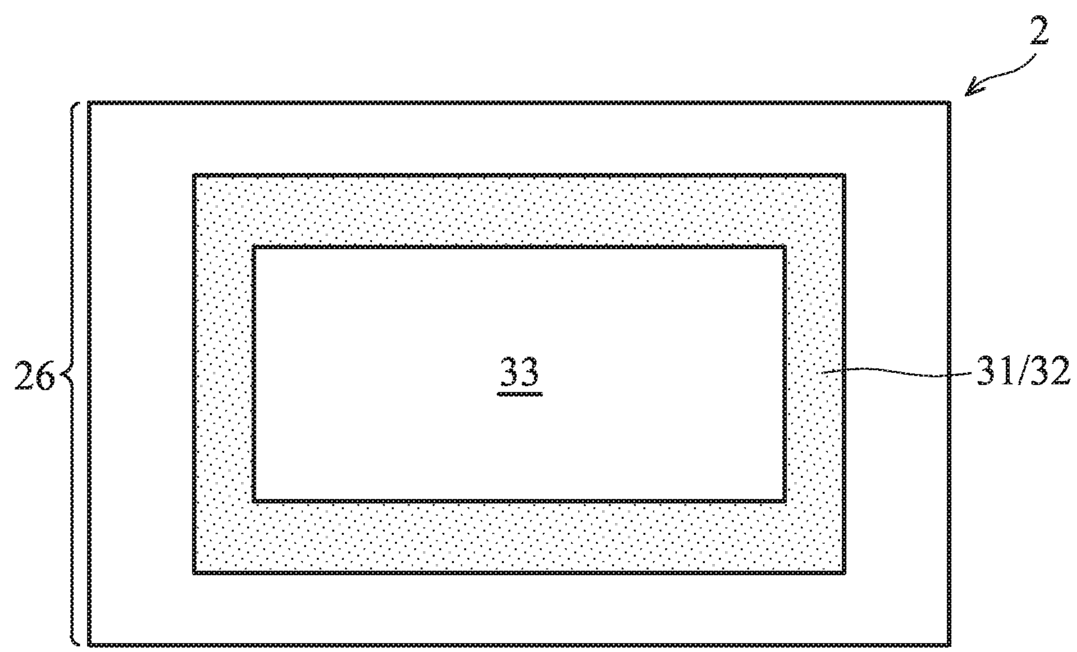

FIGS. 5A and 5B illustrate a cross-sectional view and a top view, respectively, of wafer 2 after the removal of hard mask 28 (and hard mask 29, if any). FIG. 5B illustrates that notches 31 (which forms a ring in the illustrated embodiment) overlaps implanted DI regions 32, which encircles active region 33. The edges of notches 31 are also substantially aligned to the edges of DI regions 32.

Figure 6:
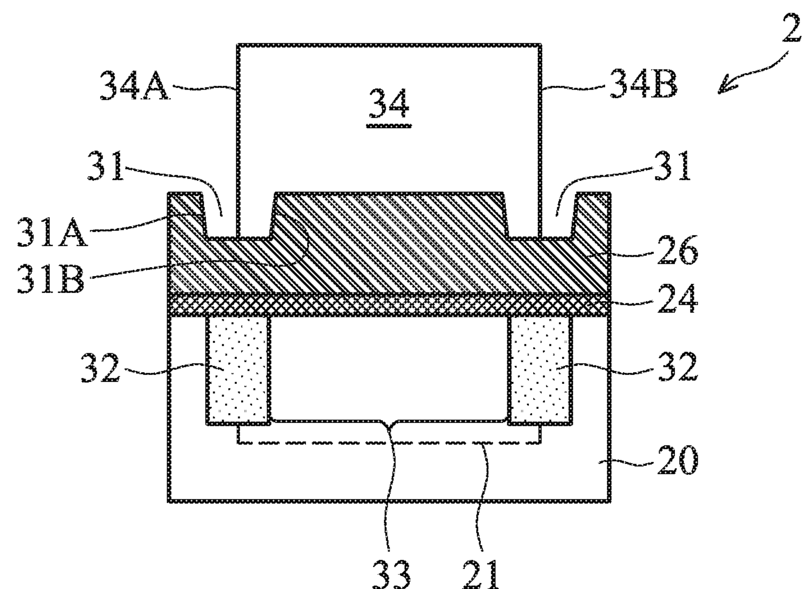

In FIG. 6, photo resist 34 is formed and patterned. The patterned photo resist 34 includes edges 34A and 34B. One or both of edges 34A and 34B is aligned to notches 31. Notches 31 are distinguishable, and may be used as the alignment mark for finding the boundaries of active region 33. Accordingly, notches 31 are used as alignment marks to accurately align edges 34A and 34B of photo resist 34 to the underlying active region 33 and implanted DI regions 32. A portion of notches 31, for example, the right half of the illustrated left notch 31, is covered by photo resist 34, and the other portion (for example, the right half of the illustrated left notch 31) of the left notch 31 is not covered by photo resist 34.

Figure 7A:
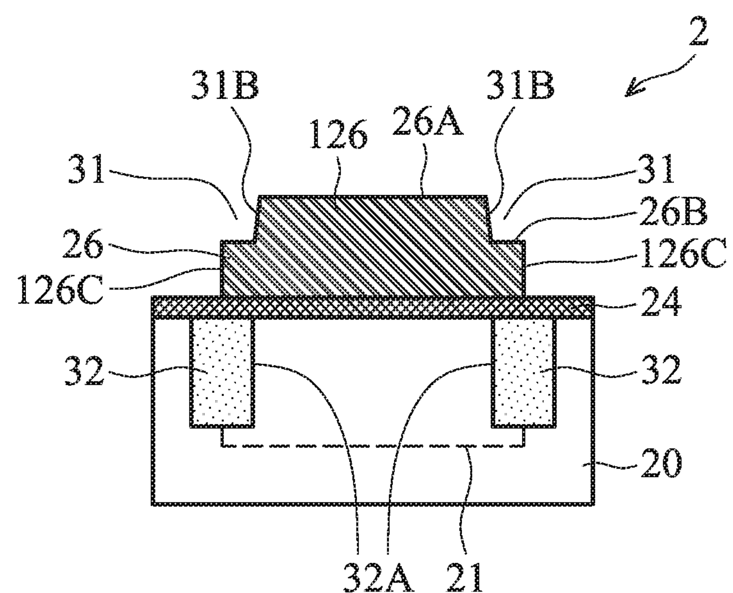
Figure 7B:
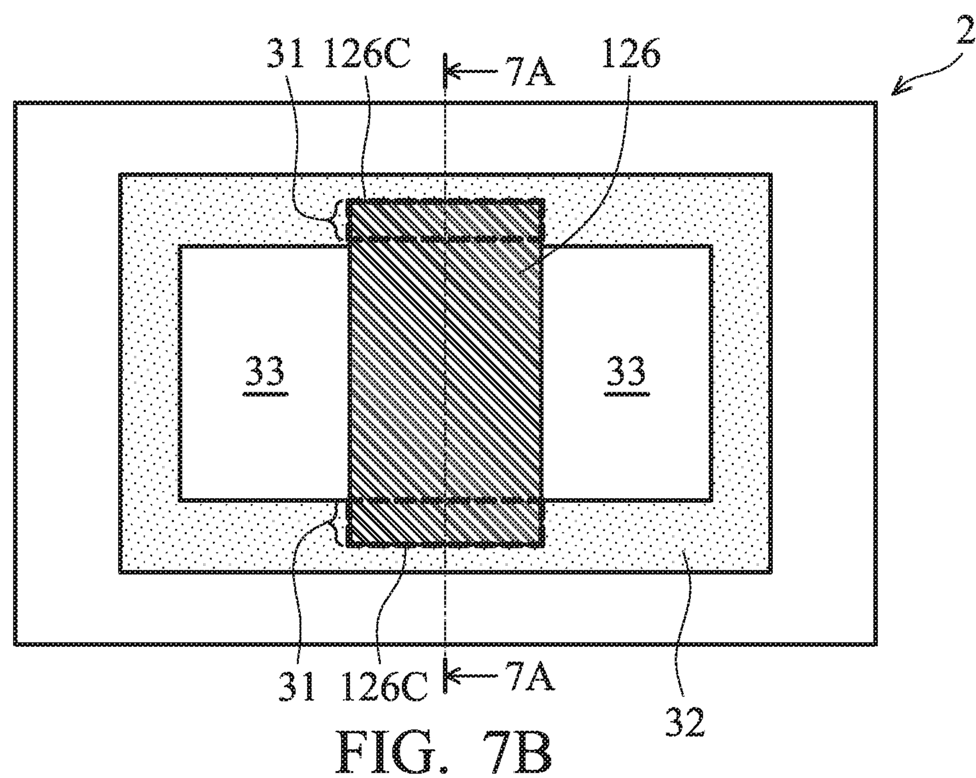

A patterning is then performed to remove the portions of gate electrode layer 26 that are uncovered by photo resist 34, so that gate electrode 126 is formed. The resulting structure is shown in FIGS. 7A and 7B. Referring back to FIG. 6, each of notches 31 includes two edges 31A and 31B facing each other. In some embodiments, edge 31A is removed along with the respective portion of gate electrode layer 26, and edge 31B remains after the etch step, as shown in FIG. 7A. The portions of gate dielectric layer 24 under the removed portion of gate electrode layer 26 may or may not be removed at this time. After the patterning of gate electrode layer 26, each of notches 31 includes a step, which is formed of top surface 26A, top surface 26B lower than top surface 26A, and edge 31B. Top surfaces 26A and 26B may be substantially flat, and may be parallel to each other. Top surface 26B extends to end 126C of gate electrode 126 in some embodiments. Edges 31B may be substantially aligned to sidewalls 32A of the respective implanted DI regions 32, which sidewalls 32A are in contact with active region 33.

Figure 7C:
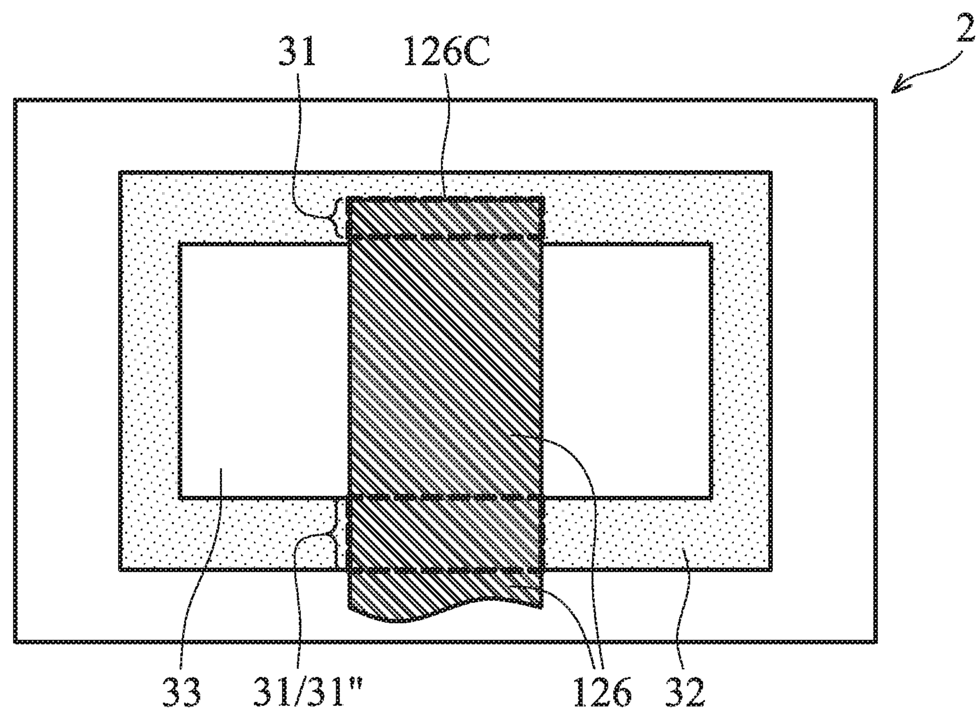

FIG. 7B is a top view of FIG. 7A, wherein the cross-sectional view in FIG. 7A is obtained from the plane crossing line 7A-7A in FIG. 7B. In some embodiments, as shown in FIG. 7B, notches 31 are formed at the opposite ends 126C of gate electrode 126. In alternative embodiments, as illustrated by dashed lines in FIG. 7C, one of notches 31 is formed at one end 126C (the upper end in FIG. 7C) of gate electrode 126, and gate electrode 126 extends beyond the other notch 31 (also marked as notch 31"). Accordingly, gate electrode 126 comprises portions on opposite sides of notch 31".

Figure 8A:
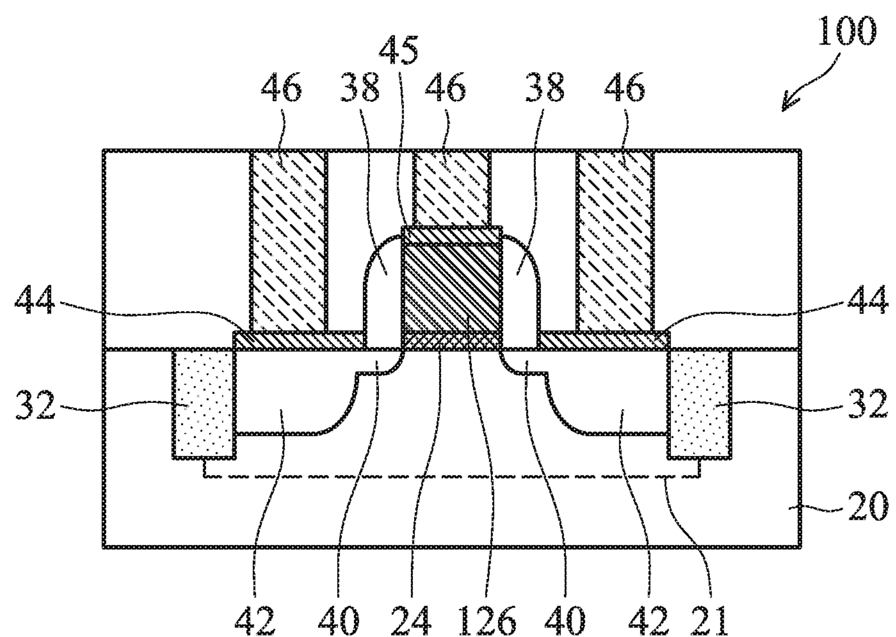
Figure 8B:
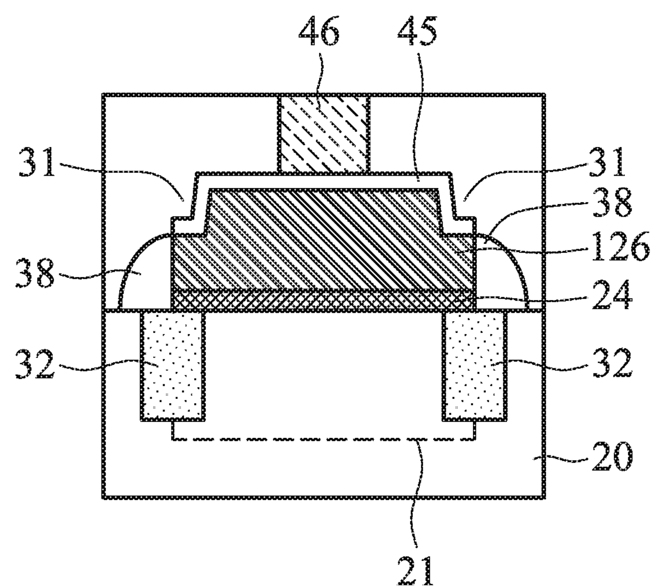
Figure 8C:
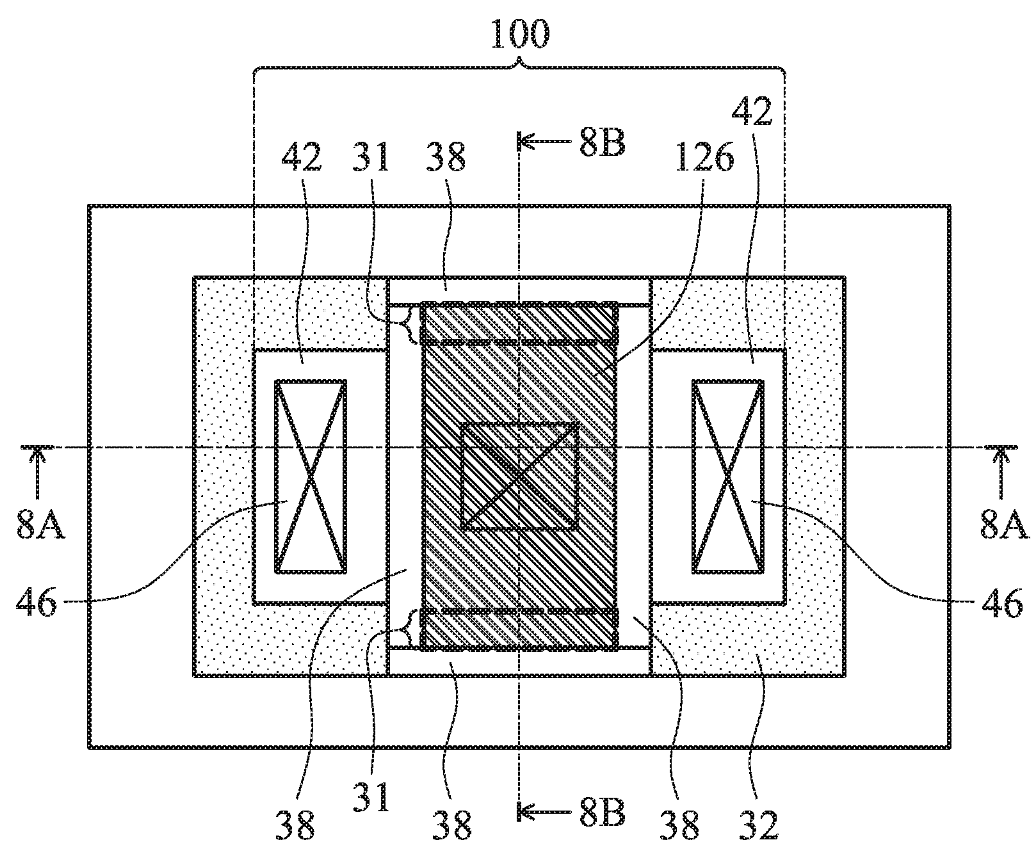

FIGS. 8A, 8B, and 8C illustrate cross-sectional views and a top view in the formation of the remaining portions of MOS device 100. FIGS. 8A and 8B are obtained from the plane crossing lines 8A-8A and 8B-8B, respectively, in FIG. 8C. Referring to FIG. 8A, the remaining portions of MOS device 100 includes gate spacers 38, source and drain extension regions 40, source and drain regions 42, source and drain silicide regions 44, gate silicide region 45, and contact plugs 46. In the formation of these components of MOS device 100, notches 31 in FIG. 7A through 7C may also be used as alignment marks. As shown in FIG. 8B, due to the existence of notches 31, gate silicide region 45 is not flat, and forms one step (or two steps), with each of the steps including a higher portion, a lower portion, and a sidewall portion. Source and drain regions 42 may be adjoining implanted DI regions 32, and have a conductivity type opposite the conductivity type of implanted DI regions 32. For example, when implanted DI regions 32 and well region 21 are of p-type, source and drain regions 42 are of n-type. Conversely, when implanted DI regions 32 and well region 21 are of n-type, source and drain regions 42 are of p-type.

Figure 9:
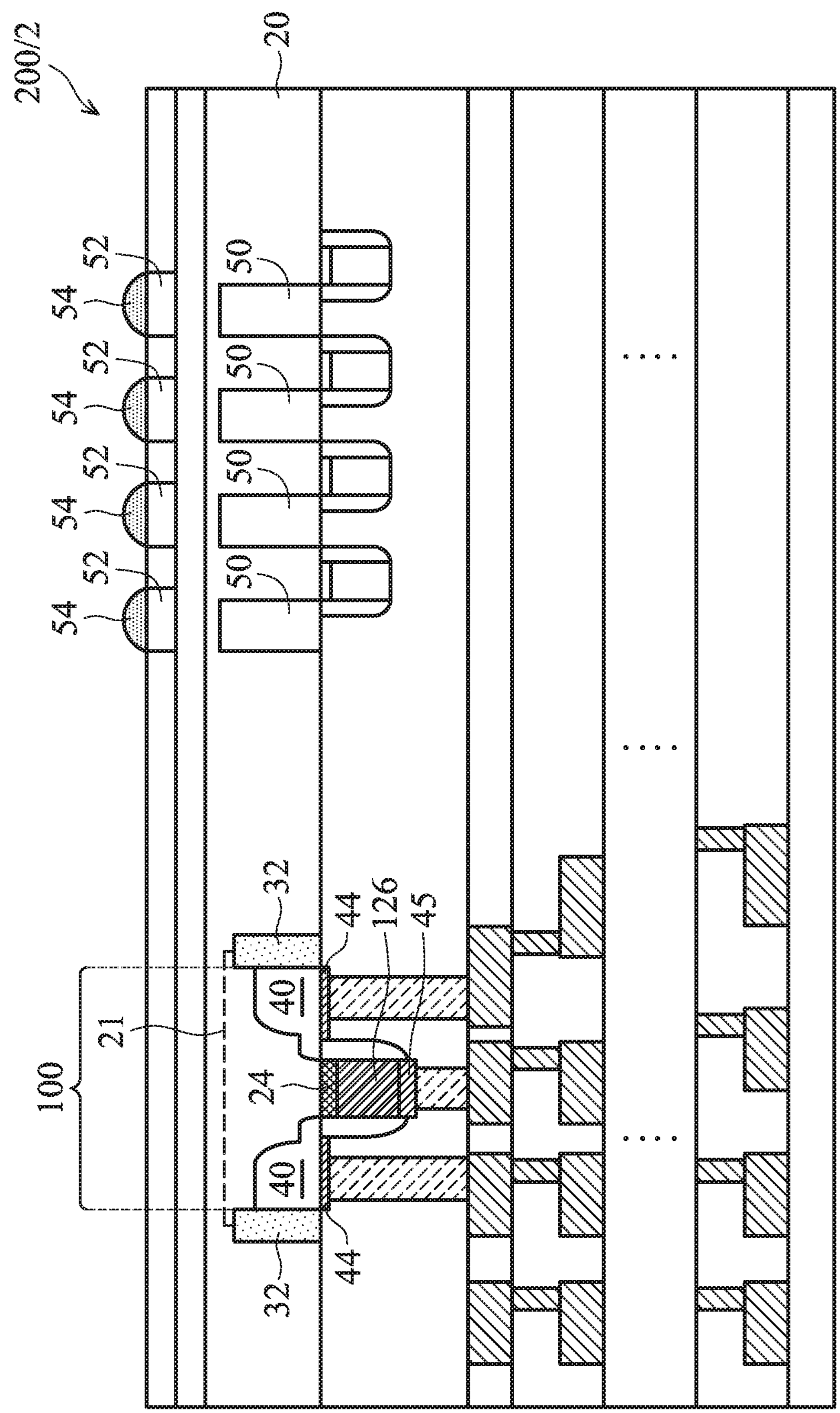
FIG. 9 illustrates a cross-sectional view of a Complementary Metal-Oxide-Semiconductor (CMOS) Image Sensor (CIS) chip comprising the MOS device as illustrated in FIGS. 8A through 8C.

In the embodiments, through the formation of notches in the gate electrode layer, the accuracy of the overlay (the alignment) in various components in integrated circuit manufacturing process is improved. The notches may be used for the formation of small-pitch devices. For example, FIG. 9 illustrates Backside Illumination (BSI) sensor chip 200 that is comprised in wafer 2. MOS device 100 and implanted DI region 32 form a part of the logic circuit in BSI image sensor chip 200. Image sensors 50, which may be formed of photo diodes, are formed at the front surface of substrate 20. On the backside of BSI image sensor chip 200 (a part of wafer 2) are color filters 52 and micro-lenses 54. Light penetrates from the backside of BSI sensor chip 200 to reach image sensors 50. BSI sensor chip 200 has a high requirement to the accuracy in the overlay of the components of MOS device 100, and the embodiments may be used.

Figure 10:
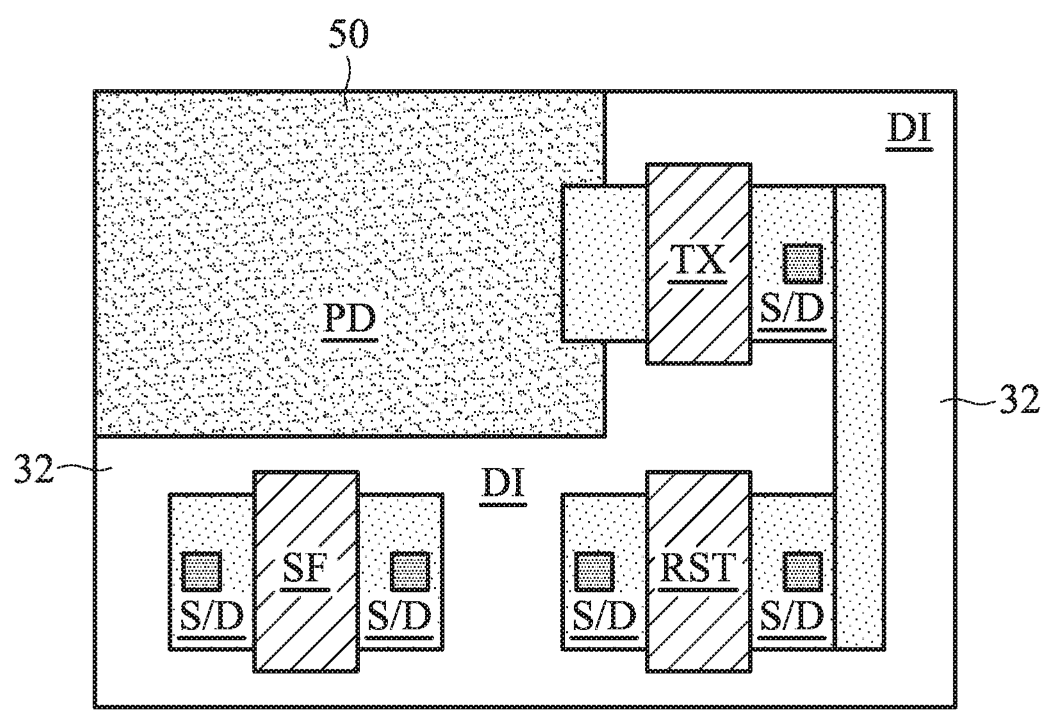
FIG. 10 illustrates a layout of an exemplary image sensor and the respective transistors serving the image sensor.

FIG. 10 illustrates a layout of an exemplary image sensor 50, which may be a Photo Diode (PD). Transfer gate transistor TX and reset transistor RST are coupled to image sensor 50. Source follower SF is formed adjacent to image sensor 50. DI region 32 is formed adjoining transfer gate transistor TX and reset transistor RST, and may encircle source follower SF. The MOS device 100 shown in FIGS.

Figure 11:
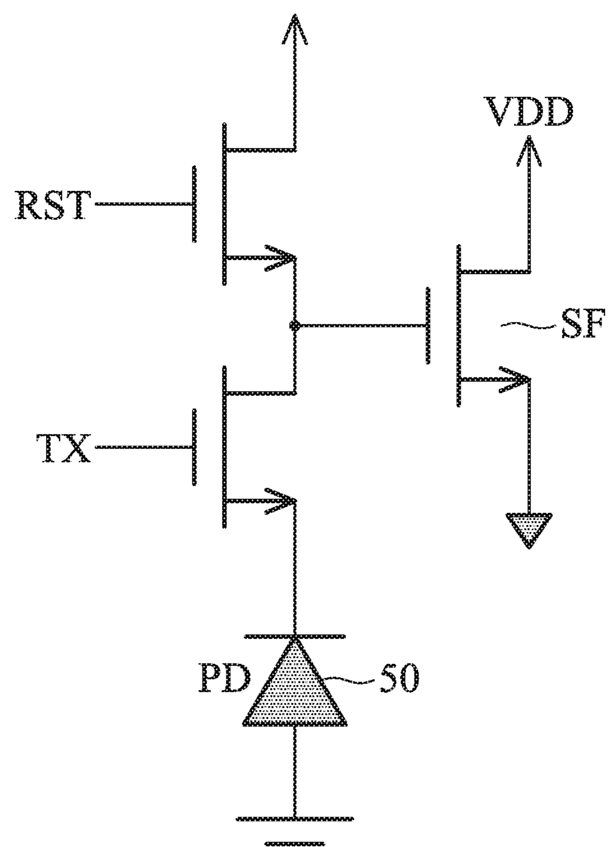
FIG. 11 illustrates a circuit diagram of the device shown in FIG. 10.

8A through 8C may be either one of transfer gate transistor TX, reset transistor RST, and source follower SF. FIG. 11 illustrates a circuit diagram of the device shown in FIG. 10.

In the embodiments, implantation DI regions are formed, whose formation incurs less damage to the surface of substrate 20 (FIG. 1) compared to the conventional Shallow Trench Isolation (STI) region. With notches formed in gate electrodes, the notches may be used as alignment marks that are used for subsequent steps. This may improve the accuracy in the process control. For example, in the patterning of gate electrodes, the accuracy is improved, and the gate electrodes may reliably extend on the DI regions, so that the source-to-drain leakage is eliminated. By using the hard mask re-deposition as shown in FIG. 4B, the DI regions may occupy a reduced chip area. The full well capacity of the image sensor is thus increased.

In accordance with some embodiments, a device includes a semiconductor substrate, and a DI region extending from a top surface of the semiconductor substrate into the semiconductor substrate. A gate dielectric is disposed over an active region of the semiconductor substrate, wherein the gate dielectric extends over the DI region. A gate electrode is disposed over the gate dielectric, wherein a notch of the gate electrode overlaps a portion of the DI region.

In accordance with other embodiments, a device includes a semiconductor substrate, and a DI region encircling an active region of the semiconductor substrate. The DI region includes a portion of the semiconductor substrate doped with a p-type or an n-type impurity. A MOS device includes a gate dielectric over the active region and overlapping a first and a second portion of the DI region. The first and the second portions of the DI region are disposed on opposite sides of the active region. A gate electrode is over the gate dielectric. The gate electrode has an end overlapping the first portion of the DI region, and a notch at the end of the gate electrode.

In accordance with yet other embodiments, a method includes forming a gate electrode layer over a semiconductor substrate, forming a hard mask over the gate electrode layer, patterning the hard mask to form an opening in the hard mask, and etching the gate electrode layer through the opening to form a notch in the gate electrode layer. An impurity is then implanted, wherein the impurity penetrates through a portion of the gate electrode layer underlying the notch to form an implanted DI region in the semiconductor substrate. The gate electrode layer is etched to form a gate electrode of a MOS device, wherein a portion of the notch remains with the gate electrode after the step of etching.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method, comprising:
forming a gate electrode layer over a semiconductor substrate;
forming a hard mask over the gate electrode layer;
patterning the hard mask to form an opening in the hard mask;
performing a first etching step using the patterned hard mask as a first etching mask to form a notch in a first portion of the gate electrode layer;
forming a patterned photo resist, wherein the patterned photo resist extends into a first portion of the notch, and a second portion of the notch is exposed through the patterned photo resist; and
performing a second etching step using the patterned photo resist as a second etching mask, wherein the gate electrode layer is further etched in the second etching step to form a gate electrode, wherein the gate electrode is a part of a Metal-Oxide-Semiconductor (MOS) device, and an additional portion of the notch remains with the gate electrode after the second etching step.

2. The method of claim 1, wherein the notch forms a full ring, and the notch has a bottom at a level between a top surface and a bottom surface of the gate electrode layer.

3. The method of claim 1, further comprising implanting an impurity, wherein the impurity penetrates through a first portion of the gate electrode layer overlapped by the notch to form an implanted Device Isolation (DI) region in the semiconductor substrate, and the DI region forms a ring encircling a portion of the semiconductor substrate.

4. The method of claim 3, wherein a second portion of the gate electrode layer has no notch formed therein, and the impurity does not penetrate through the second portion of the gate electrode layer.

5. The method of claim 3, further comprising:
forming an additional hard mask over the hard mask, wherein the additional hard mask extends into the notch, and the impurity further penetrates through the additional hard mask; and
removing the hard mask and the additional hard mask.

6. The method of claim 5, wherein the additional hard mask is formed as a conformal layer.

7. The method of claim 3, wherein the impurity is of a conductivity type opposite to a conductivity type of a source/drain region of the MOS device.

8. The method of claim 1, wherein the notch comprises a first elongated portion and a second elongated portion perpendicular to the first elongated portion, wherein after the second etching step, the first elongated portion is removed, and the second elongated portion remains.

9. The method of claim 1, wherein the second etching step is performed using the notch as an alignment mark.

10. The method of claim 1, further comprising:
forming a source region and a drain region of the MOS device, wherein the source region and the drain region are on opposite sides of the gate electrode; and
forming a source contact and a drain contact overlapping the source region and the drain region, respectively, wherein the forming the source contact and the drain contact is performed using the notch as an alignment mark.

11. A method, comprising:
etching a hard mask to form an opening extending from a top surface into a bottom surface of the hard mask;

performing a first etching step to etch a gate electrode layer underlying the hard mask and to form a notch extending from a top surface of the gate electrode layer to an intermediate level of the gate electrode layer, wherein the hard mask is used as a first etching mask in the first etching step;

removing the hard mask;

performing a second etching step using a patterned photo resist as a second etching mask to etch the gate electrode layer as a gate electrode, wherein a first portion of the gate electrode layer directly underlying a first portion of the notch remains as a part of the gate electrode; and forming a source region and a drain region on opposite sides of the gate electrode, wherein the gate electrode, the source region, and the drain region form parts of a transistor.

12. The method of claim 11, wherein a second portion of the gate electrode layer directly underlying a second portion of the notch is removed in the second etching step.

13. The method of claim 11, further comprising: forming a conformal layer extending into the notch; and performing an implantation through the conformal layer to form an implanted Device Isolation (DI) region in an underlying semiconductor substrate and overlapped by the notch.

14. The method of claim 13, wherein the conformal layer partially fills the notch.

15. The method of claim 13, wherein in the implantation, an implanted species is blocked by un-notched portions of the gate electrode layer.

16. A method, comprising:

forming a gate electrode layer over a semiconductor substrate;

forming a ring-shaped notch extending from a top surface into an intermediate level of the gate electrode layer, wherein the ring-shaped notch comprises a first portion and a second portion parallel to each other, and a third portion and a fourth portion parallel to each other, and the first portion and the second portion are perpendicular to the third portion and the fourth portion, respectively; and etching the gate electrode layer to form a gate electrode, wherein first portions of the gate electrode layer directly underlying the first portion and the second portion of the ring-shaped notch, respectively, are removed, and second portions of the gate electrode layer directly underlying the third portion and the fourth portion of the ring-shaped notch, respectively, remain after the etching.

17. The method of claim 16, further comprising implanting an implanted impurity, wherein the implanted impurity penetrates through the gate electrode layer to form an implanted region in the semiconductor substrate, wherein the implanted region forms an additional ring overlapped by the ring-shaped notch.

18. The method of claim 17, wherein the gate electrode overlaps:

a first portion of the implanted region that is directly underlying the third portion of the ring-shaped notch, and a second portion of the implanted region that is directly underlying the fourth portion of the ring-shaped notch.

19. The method of claim 16, further comprising:

forming a hard mask layer to partially fill the ring-shaped notch; and before the etching the gate electrode layer, removing the hard mask layer.

20. The method of claim 16, further comprising:

implanting the semiconductor substrate to form a source region and a drain region on opposite sides of the gate electrode; and forming a source contact and a drain contact overlapping the source region and the drain region, respectively, wherein the forming the source contact and the drain contact is performed using the ring-shaped notch as an alignment mark.

* * * * *